US012628671B2

(12) United States Patent
Wang et al.

(10) Patent No.: US 12,628,671 B2
(45) Date of Patent: May 12, 2026

(54) SUBSTRATE STRUCTURE AND MANUFACTURING METHOD THEREOF

(71) Applicant: Unimicron Technology Corp., Taoyuan City (TW)

(72) Inventors: Chin-Sheng Wang, Taoyuan City (TW); Ra-Min Tain, Hsinchu County (TW); Po-Wen Hsiao, Taoyuan City (TW); Cheng-Ta Ko, Taipei City (TW); Shih-Lian Cheng, New Taipei City (TW); Guang-Hwa Ma, Hsinchu City (TW)

(73) Assignee: Unimicron Technology Corp., Taoyuan City (TW)

( * ) Notice: Subject to any disclaimer, the term of this patent is extended or adjusted under 35 U.S.C. 154(b) by 237 days.

(21) Appl. No.: 18/677,924

(22) Filed: May 30, 2024

(65) Prior Publication Data

US 2025/0239511 A1 Jul. 24, 2025

Related U.S. Application Data

(60) Provisional application No. 63/623,823, filed on Jan. 23, 2024.

(30) Foreign Application Priority Data

Apr. 30, 2024 (TW) ................................. 113116076

(51) Int. Cl.
*H10W 70/63* (2026.01)
*H10W 70/05* (2026.01)
*H10W 70/692* (2026.01)

(52) U.S. Cl.
CPC ....... *H10W 70/635* (2026.01); *H10W 70/095* (2026.01); *H10W 70/692* (2026.01)

(58) Field of Classification Search
CPC ......................... H10W 70/635; H10W 70/095; H10W 70/692

(Continued)

(56) References Cited

U.S. PATENT DOCUMENTS

2019/0348356 A1* 11/2019 Hsieh ........................ H10D 1/20
2020/0266128 A1* 8/2020 Chen ..................... H10W 20/20

FOREIGN PATENT DOCUMENTS

CN 103904054 8/2016
CN 115910995 4/2023
TW 201837006 10/2018

OTHER PUBLICATIONS

"Office Action of Taiwan Counterpart Application", issued on Jan. 22, 2025, p. 1-p. 5.

* cited by examiner

*Primary Examiner* — Andargie M Aychillhum
(74) *Attorney, Agent, or Firm* — JCIPRNET

(57) ABSTRACT

A substrate structure includes a first substrate and a second substrate. The first substrate includes a first glass plate and at least one first conductive via penetrating the first glass plate. The second substrate includes a second glass plate and at least one second conductive via penetrating the second glass plate. The second substrate is connected to the first substrate. The second glass plate is bonded to the first glass plate through chemical bonding force and defines a chemical bonding contact surface with the first glass substrate. The at least one second conductive via is bonded to the at least one first conductive via through metal diffusion and defines at least one metal bonding contact surface with the at least one first conductive via.

11 Claims, 12 Drawing Sheets

(58) Field of Classification Search
USPC ........................................................ 174/258
See application file for complete search history.

SUBSTRATE STRUCTURE AND MANUFACTURING METHOD THEREOF

CROSS-REFERENCE TO RELATED APPLICATION

This application claims the priority benefit of U.S. provisional application Ser. No. 63/623,823, filed on Jan. 23, 2024, and Taiwan application serial no. 113116076, filed on Apr. 30, 2024. The entirety of each of the above-mentioned patent applications is hereby incorporated by reference herein and made a part of this specification.

BACKGROUND

Technical Field

The disclosure relates to a substrate structure and a manufacturing method thereof, and more particularly, to a substrate structure having a conductive via and a manufacturing method thereof.

Description of Related Art

Currently, to manufacture a through glass via (TGV) with a high aspect ratio (AR) in a glass substrate, the glass substrates are usually connected through a resin material, and the through glass vias in the two glass substrates are electrically connected through conductive paste in the resin material. That is to say, after the two glass substrates are connected, there is conductive paste between the through glass vias. In addition, a thickness of the used glass substrate is greater than 200 microns, such as 500 microns, and the through glass via with the high aspect ratio is formed through processes such as laser, etching, and hole filling. As a result, it is difficult to manufacture the through glass via with the high aspect ratio in the glass substrate.

SUMMARY

The disclosure provides a substrate structure and a manufacturing method thereof, which forms a through glass via with a high aspect ratio by using chemical bonding force and metal diffusion bonding force, having advantages of simple manufacturing processes, reduced costs, and increased production capacity.

A substrate structure in the disclosure includes a first substrate and a second substrate. The first substrate includes a first glass plate and at least one first conductive via penetrating the first glass plate. The second substrate includes a second glass plate and at least one second conductive via penetrating the second glass plate. The second substrate is connected to the first substrate. The second glass plate is bonded to the first glass plate through chemical bonding force and defines a chemical bonding contact surface with the first glass plate. The at least one second conductive via is bonded to the at least one first conductive via through metal diffusion and defines at least one metal bonding contact surface with the at least one first conductive via.

In an embodiment of the disclosure, the substrate structure further includes a first metal layer and a second metal layer. The first metal layer is disposed on at least one first end of the at least one first conductive via. The second metal layer is disposed on at least one second end of the at least one second conductive via. The at least one first end faces the at least one second end. The second metal layer is bonded to the first metal layer and defines the at least one metal bonding contact surface with the first metal layer.

In an embodiment of the disclosure, a material of the at least one first conductive via and a material of the at least one second conductive via include copper, respectively. A material of the at least one first metal layer and a material of the at least one second metal layer include gold, respectively.

In an embodiment of the disclosure, the first substrate further includes a first silicon oxide layer covering a peripheral surface of the first glass plate and partially located between the at least one first conductive via and the first glass plate. The second substrate further includes a second silicon oxide layer covering a peripheral surface of the second glass plate and partially located between the at least one second conductive via and the second glass plate. The second silicon oxide layer is bonded to the first silicon oxide layer and defines the chemical bonding contact surface with the first silicon oxide layer.

In an embodiment of the disclosure, a first thickness of the first glass plate and a second thickness of the second glass plate are respectively greater than 50 microns and less than or equal to 400 microns.

In an embodiment of the disclosure, a first diameter of the at least one first conductive via and a second diameter of the at least one second conductive via are respectively greater than 10 microns and less than or equal to 100 microns.

A substrate structure in the disclosure includes a first substrate and a second substrate. The first substrate includes a first glass plate, at least one first conductive via penetrating the first glass plate, and a first organic resin layer. The first organic resin layer is bonded to a first surface and a second surface of the first glass plate that are opposite to each other through chemical bonding force. The second substrate includes a second glass plate, at least one second conductive via penetrating the second glass plate, and a second organic resin layer. The second organic resin layer is bonded to a third surface and a fourth surface of the second glass plate that are opposite to each other through the chemical bonding force. The second substrate is connected to the first substrate. The second organic resin layer is bonded to the first organic resin layer through high-temperature plasticization and defines a resin bonding contact surface with the first organic resin layer. The at least one second conductive via is bonded to the at least one first conductive via through metal diffusion and defines at least one metal bonding contact surface with the at least one first conductive via.

In an embodiment of the disclosure, the substrate structure further includes a first metal layer and a second metal layer. The first metal layer is disposed on at least one first end of the at least one first conductive via. The second metal layer is disposed on at least one second end of the at least one second conductive via. The at least one first end faces the at least one second end. The second metal layer is bonded to the first metal layer and defines the at least one metal bonding contact surface with the first metal layer.

In an embodiment of the disclosure, a material of the first organic resin layer and a material of the second organic resin layer include liquid crystal polymer, respectively.

In an embodiment of the disclosure, a first thickness of the first glass plate and a second thickness of the second glass plate are respectively greater than 50 and less than or equal to 400 microns.

In an embodiment of the disclosure, a diameter of the at least one first conductive via and a diameter of the at least one second conductive via are respectively greater than 10 and less than or equal to 100 microns.

A manufacturing method of a substrate structure includes the following. A first substrate and a second substrate are provided. The first substrate includes a first glass plate and at least one first conductive via penetrating the first glass plate. The second substrate includes a second glass plate and at least one second conductive via penetrating the second glass plate. The second substrate is bonded to the first substrate. The second glass plate is bonded to the first glass plate through chemical bonding force and forms a chemical bonding contact surface with the first glass plate. The at least one second conductive via is bonded to the at least one first conductive via through metal diffusion and forms at least one metal bonding contact surface with the at least one first conductive via.

In an embodiment of the disclosure, the manufacturing method of the substrate structure further includes the following. Before the second substrate is bonded to the first substrate, a first metal layer is formed on at least one first end of the at least one first conductive via, and a second metal layer is formed on at least one second end of the at least one second conductive via. The at least one first end faces the at least one second end. When the second substrate is bonded to the first substrate, the second metal layer is bonded to the first metal layer and defines the at least one metal bonding contact surface with the first metal layer.

In an embodiment of the disclosure, the manufacturing method of the substrate structure further includes the following. Before the second substrate is bonded to the first substrate, a first silicon oxide layer is formed to cover a peripheral surface of the first glass plate, in which a portion of the first silicon oxide layer is located between the at least one first conductive via and the first glass plate, and a second silicon oxide layer is formed to cover a peripheral surface of the second glass plate, in which a portion of the second silicon oxide layer is located between the at least one second conductive via and the second glass plate. When the second substrate is bonded to the first substrate, the second silicon oxide layer is bonded to the first silicon oxide layer and defines the chemical bonding contact surface with the first silicon oxide layer.

Based on the above, in the substrate structure and the manufacturing method thereof in the disclosure, the second glass plate is bonded to the first glass plate through the chemical bonding force and defines the chemical bonding contact surface with the first glass plate, while the second conductive via is bonded to the first conductive via through the metal diffusion and defines the metal bonding contact surface with the first conductive via, so that the second substrate is connected to the first substrate to form the substrate structure having the through glass via with a high aspect ratio. Compared to the conventional technology, there is no need to add additional resin materials having the conductive paste and/or use the high-thickness glass substrates, and has the advantages of simple manufacturing processes, reduced costs, and increased production capacity.

In order for the aforementioned features and advantages of the disclosure to be more comprehensible, embodiments accompanied with drawings are described in detail below.

DETAILED DESCRIPTION OF DISCLOSED EMBODIMENTS

The embodiments of the disclosure can be understood together with the drawings, and the drawings of the disclosure are also regarded as a part of the disclosure description. It is to be understood that the drawings of the disclosure are not to scale and, in fact, the dimensions of elements may be arbitrarily enlarged or reduced in order to clearly represent the features of the disclosure.

Figure 1A:
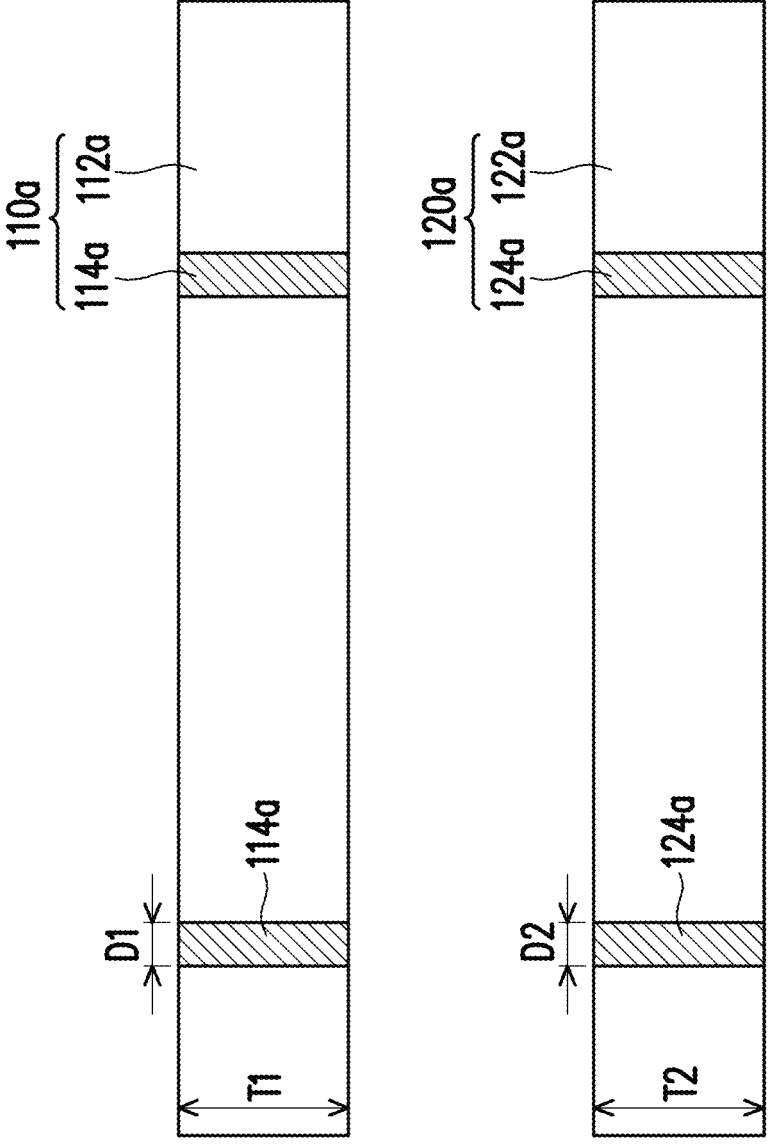
FIGS. 1A to 1B are schematic cross-sectional views of a manufacturing method of a substrate structure according to an embodiment of the disclosure.
Figure 1B:
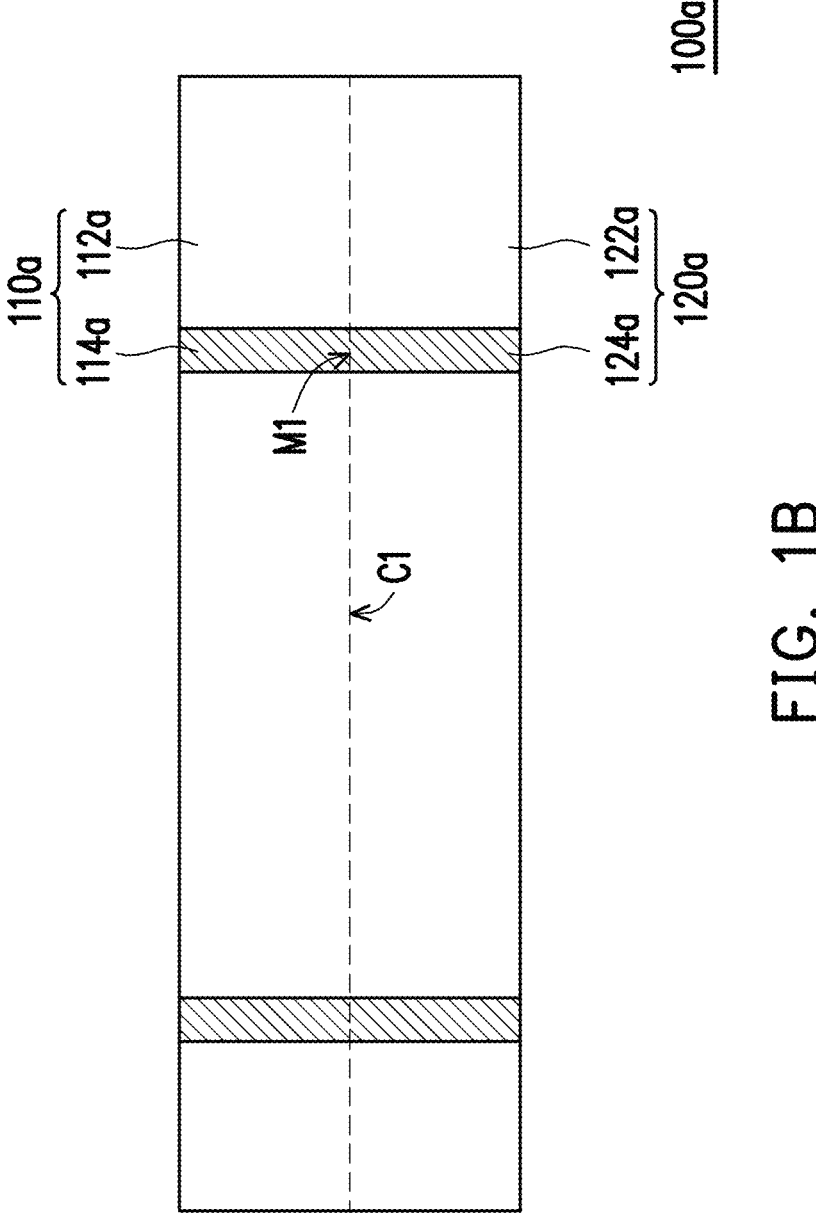

FIGS. 1A to 1B are schematic cross-sectional views of a manufacturing method of a substrate structure according to an embodiment of the disclosure. According to the manufacturing method of the substrate structure in this embodiment, first, referring to FIG. 1A, a first substrate $110a$ and a second substrate $120a$ are provided. The first substrate $110a$ includes a first glass plate $112a$ and at least one first conductive via penetrating the first glass plate $112a$ (in which two first conductive vias $114a$ are schematically shown). A first thickness T1 of the first glass plate $112a$ is, for example, greater than 50 microns and less than or equal to 400 microns. The first conductive via $114a$ is a through glass via, and a material thereof is, for example, copper. A first diameter D1 of the first conductive via $114a$ is, for example, greater than 10 microns and less than or equal to 100 microns.

The second substrate $120a$ includes a second glass plate $122a$ and at least one second conductive via penetrating the second glass plate $122a$ (in which two second conductive vias $124a$ are schematically shown). A second thickness T2 of the second glass plate $122a$ is, for example, greater than 50 microns and less than or equal to 400 microns. The second conductive via $124a$ is a through glass via, and a material thereof is, for example, copper. A second diameter D2 of the second conductive via $124a$ is, for example, greater than 10 microns and less than or equal to 100 microns. Here, a structure and size of the first substrate $110a$ are substantially the same as a structure and size of the second substrate $120a$. In an embodiment, the first thickness T1 of the first glass plate $112a$ may be different from the second thickness T2 of the second glass plate $122a$, but the first diameter D1 of the first conductive via $114a$ is required to be equal to the second diameter D2 of the second conductive via $124a$.

Next, referring to FIG. 1A again, a hydrolysis process, which is a so-called hydrolysis reaction, is performed on a surface of the first glass plate $112a$ of the first substrate $110a$ and a surface of the second glass plate $122a$ of the second substrate $120a$ to form a covalent bond between the surface of the first glass plate $112a$ and the surface of the second glass plate $122a$. It should be noted that the hydrolysis reaction is a reaction process, in which in a concept of organic chemistry, it refers to a reaction of water with another compound, and the compound is decomposed into two parts, in which H+ in the water is added to one part, and a hydroxyl group (—OH) is added to the other part, thereby obtaining two or more new compounds, while in a concept of inorganic chemistry, a weak acid radical or weak base ion reacts with water to generate a weak acid and a hydroxide ion (OH–) (or a weak base and a hydrogen ion (H+)).

After that, referring to FIG. 1B, the second substrate 120a is bonded to the first substrate 110a at a high temperature. The second glass plate 122a is bonded to the first glass plate 112a through chemical bonding force and forms a chemical bonding contact surface C1 with the first glass plate 112a. On the other hand, the second conductive via 124a is bonded to the first conductive via 114a through metal diffusion and forms a metal bonding contact surface M1 with the first conductive via 114a. So far, fabrication of a substrate structure 100a has been completed.

Structurally, referring to FIG. 1B again, the substrate structure 100a includes the first substrate 110a and the second substrate 120a. The first substrate 110a includes the first glass plate 112a and the first conductive via 114a penetrating the first glass plate 112a. The second substrate 120a includes the second glass plate 122a and the second conductive via 124a penetrating the second glass plate 122a. The second substrate 120a is connected to the first substrate 110a. The second glass plate 122a is bonded to the first glass plate 112a through the chemical bonding force and defines the chemical bonding contact surface C1 with the first glass plate 112a. The second conductive via 124a is bonded to the first conductive via 114a through the metal diffusion and defines the metal bonding contact surface M1 with the first conductive via 114a. Here, the second glass plate 122a is in direct contact with the first glass plate 112a, and the second conductive via 124a is in direct contact with the first conductive via 114a.

In short, in this embodiment, the second glass plate 122a is bonded to the first glass plate 112a through the chemical bonding force and defines the chemical bonding contact surface C1 with the first glass plate 112a, while the second conductive via 124a is bonded to the first conductive via 114a through the metal diffusion and defines the metal bonding contact surface M1 with the first conductive via 114a, so that the second substrate 120a is connected to the first substrate 110a to form the substrate structure 100a having the through glass via with a high aspect ratio. Compared to the conventional technology, in this embodiment, there is no need to add additional resin materials having conductive paste and/or use high-thickness glass substrates, and has advantages of simple manufacturing processes, reduced costs, and increased production capacity.

Some other embodiments are provided below to describe the invention in detail. It is noted that some of the reference numerals and descriptions of the above embodiment will apply to the following embodiments. The same reference numerals will represent the same or similar components and the descriptions of the same technical contents will be omitted. Reference may be made to the above embodiment for the omitted descriptions, which will not be repeated in the following embodiments.

Figure 2A:
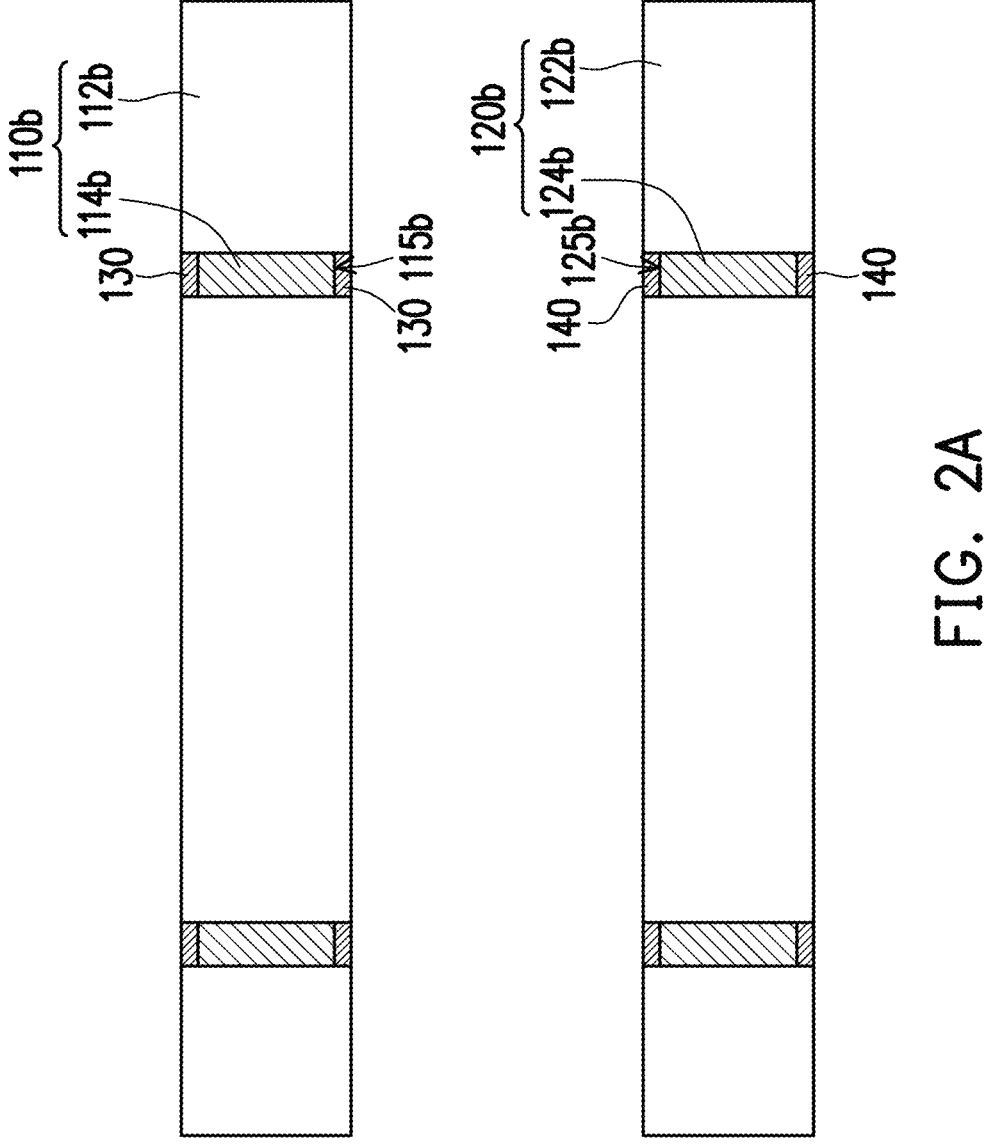
FIGS. 2A to 2B are schematic cross-sectional views of a manufacturing method of a substrate structure according to another embodiment of the disclosure.
Figure 2B:
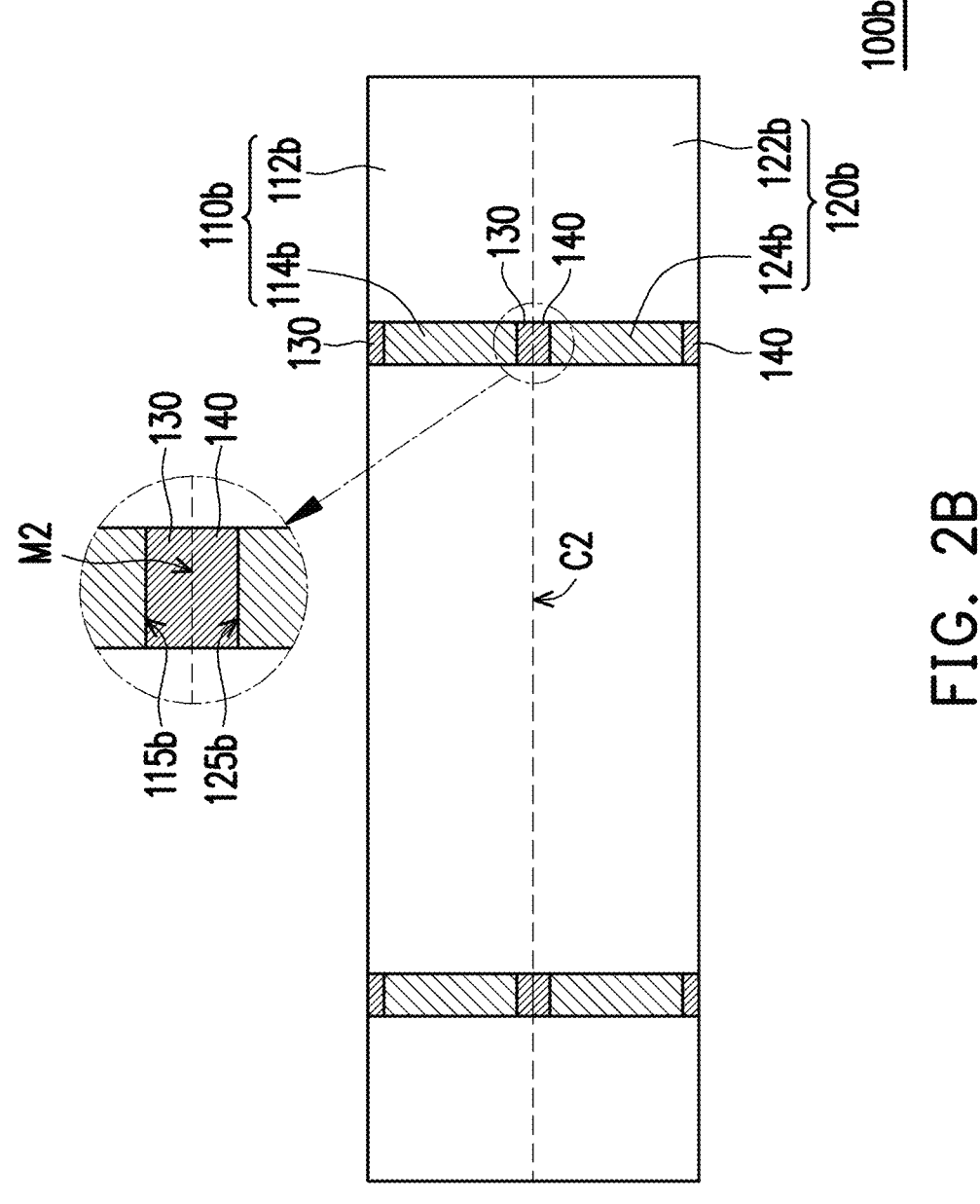

FIGS. 2A to 2B are schematic cross-sectional views of a manufacturing method of a substrate structure according to another embodiment of the disclosure. Referring to both FIGS. 1A and 2A, the manufacturing method of the substrate structure in this embodiment is similar to the manufacturing method of the above substrate structure. However, a main difference between the two is that in this embodiment, before a second substrate 120b is bonded to a first substrate 110b, a first metal layer 130 is formed on a first end 115b of a first conductive via 114b, and a second metal layer 140 is formed on a second end 125b of a second conductive via 124b. The first end 115b faces the second end 125b. A material of the first metal layer 130 and a material of the second metal layer 140 are, for example, gold, respectively, and may be deposited on the first conductive via 114b and the second conductive via 124b respectively through a plating process such as electroless plating, immersion plating, or similar processes.

Next, referring to FIG. 2A again, the hydrolysis process is performed on a surface of a first glass plate 112b of the first substrate 110b and on a surface of a second glass plate 122b of the second substrate 120b to form a covalent bond between the surface of the first glass plate 112b and the surface of the second glass plate 122b.

After that, referring to FIG. 2B, the second substrate 120b is bonded to the first substrate 110b at the high temperature. The second glass plate 122b is bonded to the first glass plate 112b through the chemical bonding force and forms a chemical bonding contact surface C2 with the first glass plate 112b. On the other hand, the second metal layer 140 is bonded to the first metal layer 130 through the metal diffusion and defines a metal bonding contact surface M2 with the first metal layer 130. Here, the second glass plate 122b is in direct contact with the first glass plate 112b, and the second metal layer 140 is in direct contact with the first metal layer 130. So far, fabrication of a substrate structure 100b having the through glass via with a high aspect ratio has been completed.

Figure 3A:
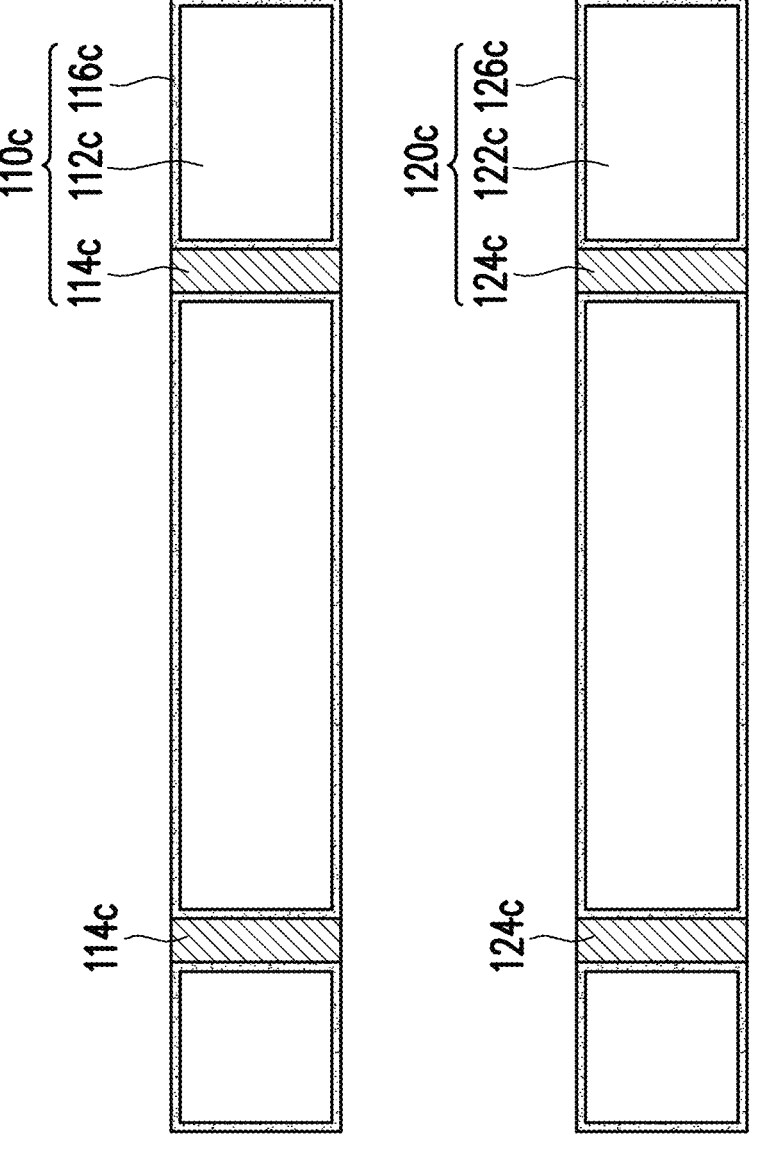
FIGS. 3A to 3B are schematic cross-sectional views of a manufacturing method of a substrate structure according to another embodiment of the disclosure.
Figure 3B:
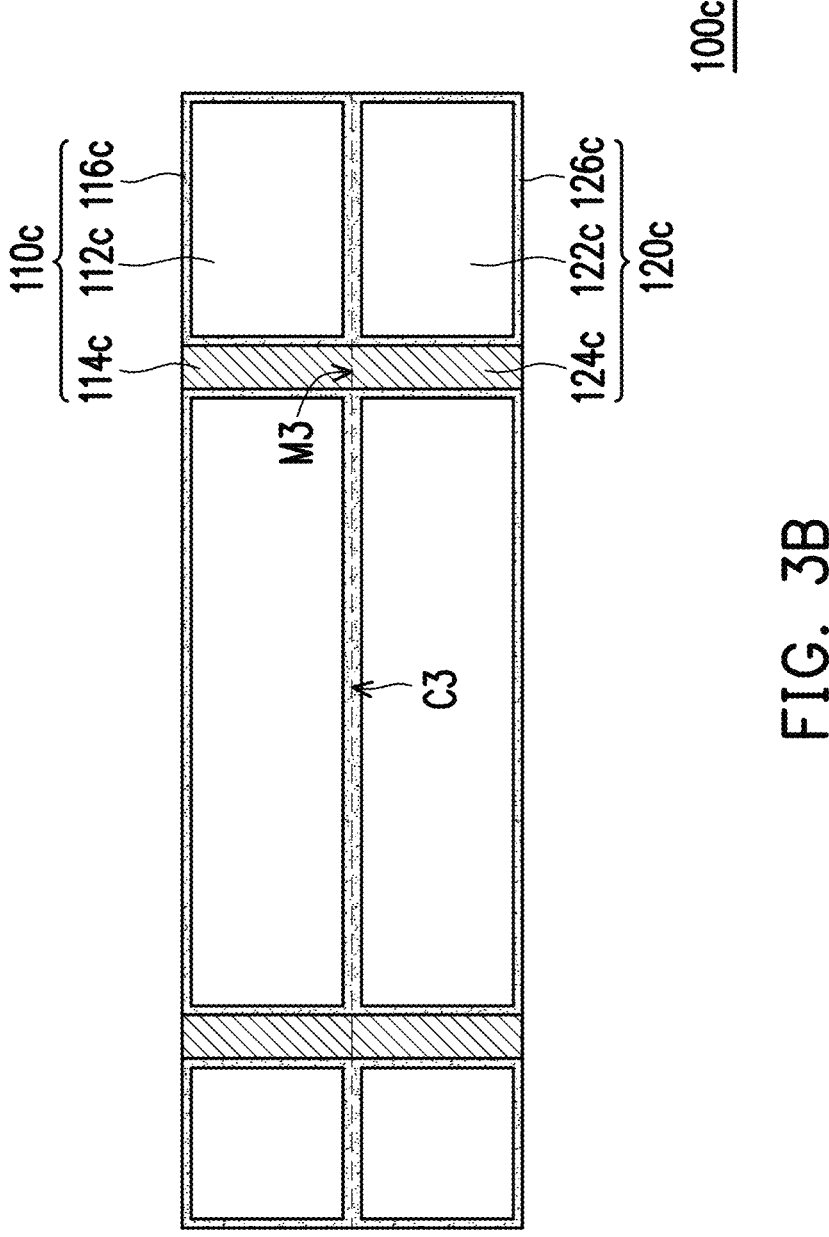

FIGS. 3A to 3B are schematic cross-sectional views of a manufacturing method of a substrate structure according to another embodiment of the disclosure. Referring to both FIGS. 1A and 3A, the manufacturing method of the substrate structure in this embodiment is similar to the manufacturing method of the above substrate structure. However, a main difference between the two is that in this embodiment, before a second substrate 120c is bonded to a first substrate 110c, a first silicon oxide layer 116c is formed to cover a peripheral surface of a first glass plate 112c. A portion of the first silicon oxide layer 116c is located between a first conductive via 114c and the first glass plate 112c. A second silicon oxide layer 126c is formed to cover a peripheral surface of a second glass plate 122c. A portion of the second silicon oxide layer 126c is located between a second conductive via 124c and the second glass plate 122c. In an embodiment, the first silicon oxide layer 116c may be formed on the first glass plate 112c and the second silicon oxide layer 126c may be formed on the second glass plate 122c by, for example, depositing. A material of the first silicon oxide layer 116c and a material of the second silicon oxide layer 126c may be, for example, silicon dioxide, respectively, but the disclosure is not limited thereto.

Next, referring to FIG. 3A again, a chemical processing is performed on the first silicon oxide layer 116c of the first substrate 110c and the second silicon oxide layer 126c of the second substrate 120c to form a chemical bond between a surface of the first silicon oxide layer 116c and a surface of the second silicon oxide layer 126c. The chemical processing described here is the so-called hydrolysis reaction, and the covalent bond is formed between the surface of the first glass plate 112a and the surface of the second glass plate 122a. It should be noted that the hydrolysis reaction is the reaction process, in which in the concept of organic chemistry, it refers to the reaction of water with another compound, and the compound is decomposed into two parts, in which H+ in the water is added to one part, and the hydroxyl group (—OH) is added to the other part, thereby obtaining two or more new compounds, while in the concept of inorganic chemistry, the weak acid radical or weak base ion reacts with water to generate the weak acid and the hydroxide ion (OH–) (or the weak base and the hydrogen ion (H+)).

After that, referring to FIG. 3B, the second substrate 120c is bonded to the first substrate 110c at the high temperature. The second silicon oxide layer 126c is bonded to the first silicon oxide layer 116c through the chemical bonding force and defines a chemical bonding contact surface C3 with the first silicon oxide layer 116c. On the other hand, the second conductive via 124c is bonded to the first conductive via 114c through the metal diffusion and forms a metal bonding contact surface M3 with the first conductive via 114c. So far, fabrication of a substrate structure 100c having the through glass via with a high aspect ratio has been completed.

Figure 4A:
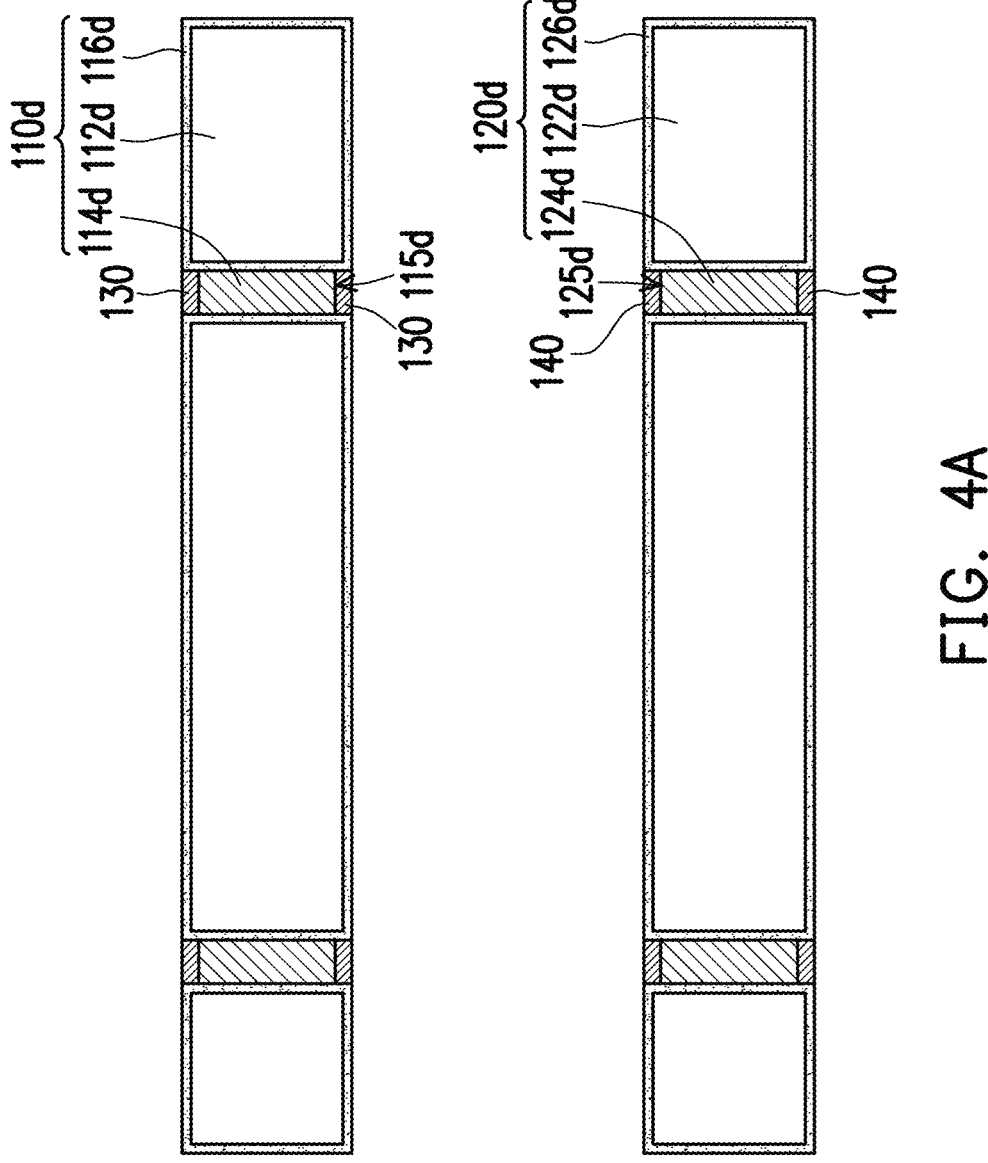
FIGS. 4A to 4B are schematic cross-sectional views of a manufacturing method of a substrate structure according to another embodiment of the disclosure.
Figure 4B:
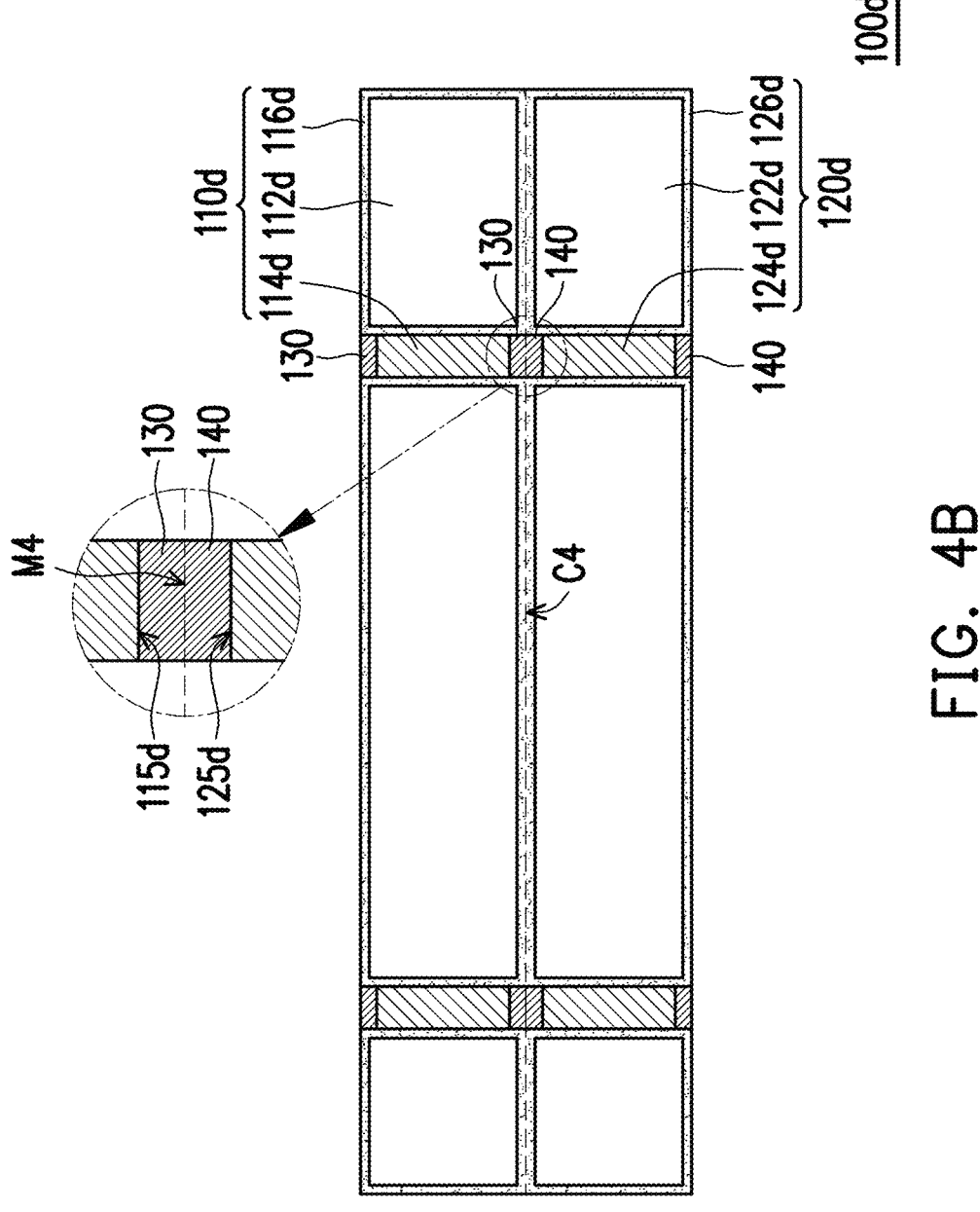

FIGS. 4A to 4B are schematic cross-sectional views of a manufacturing method of a substrate structure according to another embodiment of the disclosure. Referring to both FIGS. 3A and 4A, the manufacturing method of the substrate structure in this embodiment is similar to the manufacturing method of the above substrate structure. However, a main difference between the two is that in this embodiment, after a first silicon oxide layer 116d and a second silicon oxide layer 126d are formed to respectively cover a peripheral surface of a first glass plate 112d and a peripheral surface of a second glass plate 122d, and before a second substrate 120d is bonded to a first substrate 110d, the first metal layer 130 is formed on a first end 115d of a first conductive via 114d, and the second metal layer 140 is formed on a second end 125d of a second conductive via 124d. The first end 115d faces the second end 125d. The material of the first metal layer 130 and the material of the second metal layer 140 are, for example, gold, respectively, and may be deposited on the first conductive via 114d and the second conductive via 124d respectively through the plating process such as electroless plating, immersion plating, or similar processes.

Next, referring to FIG. 4A again, the chemical processing is performed on the first silicon oxide layer 116d of the first substrate 110d and the second silicon oxide layer 126d of the second substrate 120d to form a chemical bond between a surface of the first silicon oxide layer 116d and a surface of the second silicon oxide layer 126d. The chemical processing described here is the so-called hydrolysis reaction, and the covalent bond is formed between the surface of the first glass plate 112a and the surface of the second glass plate 122a. It should be noted that the hydrolysis reaction is the reaction process, in which in the concept of organic chemistry, it refers to the reaction of water with another compound, and the compound is decomposed into two parts, in which H+ in the water is added to one part, and the hydroxyl group (—OH) is added to the other part, thereby obtaining two or more new compounds, while in the concept of inorganic chemistry, the weak acid radical or weak base ion reacts with water to generate the weak acid and the hydroxide ion (OH–) (or the weak base and the hydrogen ion (H+)).

After that, referring to FIG. 4B, the second substrate 120d is bonded to the first substrate 110d at the high temperature. The second silicon oxide layer 126d is bonded to the first silicon oxide layer 116d through the chemical bonding force and defines a chemical bonding contact surface C4 with the first silicon oxide layer 116d. On the other hand, the second metal layer 140 is bonded to the first metal layer 130 through the metal diffusion and defines a metal bonding contact surface M4 with the first metal layer 130. So far, fabrication of a substrate structure 100d having the through glass via with a high aspect ratio has been completed.

Figure 5A:
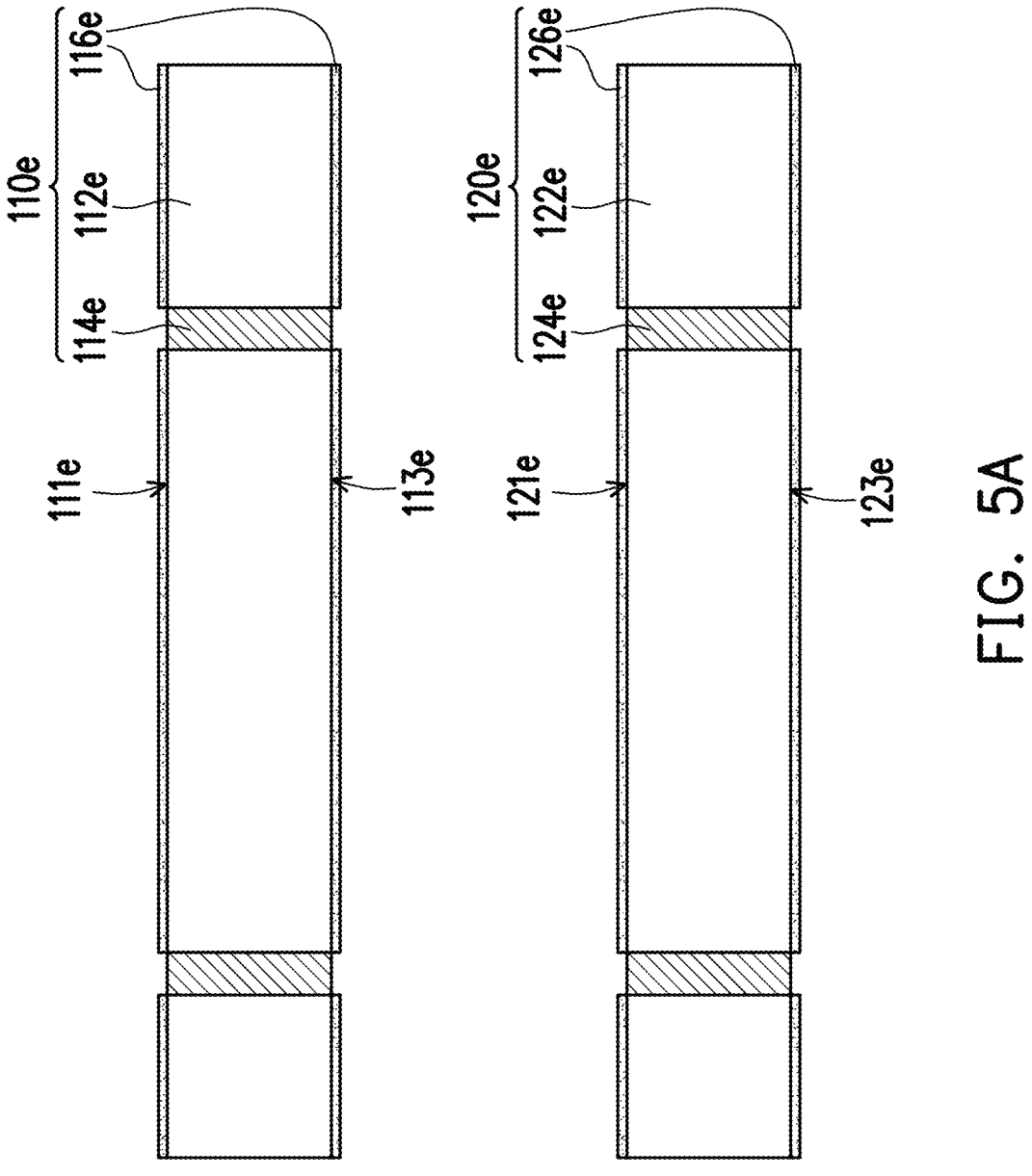
FIGS. 5A to 5B are schematic cross-sectional views of a manufacturing method of a substrate structure according to another embodiment of the disclosure.
Figure 5B:
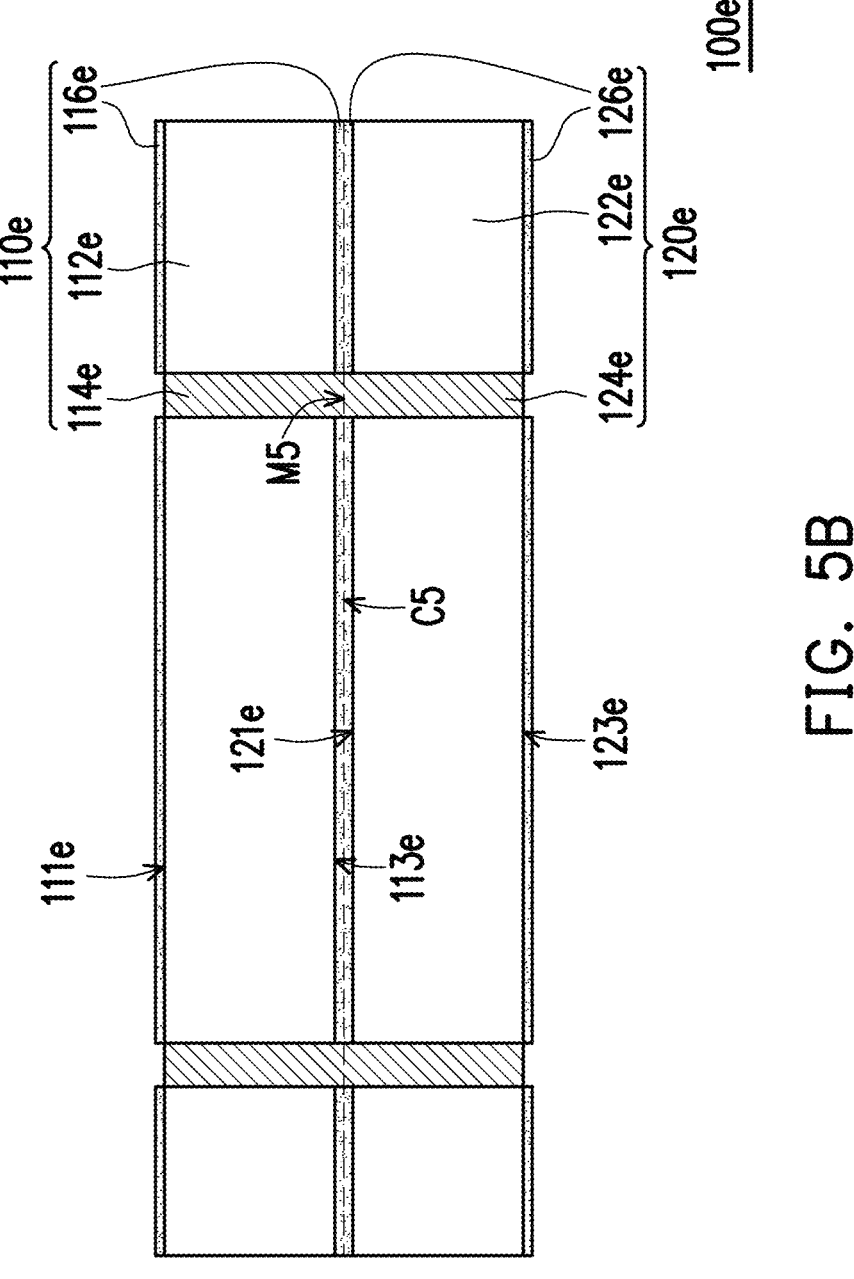

FIGS. 5A to 5B are schematic cross-sectional views of a manufacturing method of a substrate structure according to another embodiment of the disclosure. Referring to both FIGS. 1A and 5A, the manufacturing method of the substrate structure in this embodiment is similar to the manufacturing method of the above substrate structure. However, a main difference between the two is that in this embodiment, before a second substrate 120e is bonded to a first substrate 110e, a first organic resin layer 116e is formed on a first surface 111e and a second surface 113e of a first glass plate 112e that are opposite to each other, and a second organic resin layer 126e is formed on a third surface 121e and a fourth surface 123e of a second glass plate 122e that are opposite to each other. In an embodiment, a material of the first organic resin layer 116e and a material of the second organic resin layer 126e are, for example, liquid crystal polymer (LCP), respectively, but the disclosure is not limited thereto.

Referring to FIG. 5A again, the first organic resin layer 116e is bonded to the first surface 111e and the second surface 113e of the first glass plate 112e that are opposite to each other through the chemical bonding force. Specifically, a layer of silane coupling agent is first applied to the first surface 111e and the second surface 113e of the first glass plate 112e that are opposite to each other to form a chemical bond, and then is bonded to the first organic resin layer 116e. Similarly, the second organic resin layer 126e is bonded to the third surface 121e and the fourth surface 123e of the second glass plate 122e that are opposite to each other through the chemical bonding force. A layer of silane coupling agent is first applied to the third surface 121e and the fourth surface 123e of the second glass plate 122e that are opposite to each other to form a chemical bond, and then is bonded to the second organic resin layer 126e.

After that, referring to FIG. 5B, when the second substrate 120e is bonded to the first substrate 110e, the second organic resin layer 126e is bonded to the first organic resin layer 116e through high-temperature plasticization and defines a resin bonding contact surface C5 with the first organic resin layer 116e. On the other hand, a second conductive via 124e is bonded to a first conductive via 114e through thermal expansion contact and the metal diffusion and forms a metal bonding contact surface M5 with the first conductive via 114e. So far, fabrication of a substrate structure 100e having the through glass via with a high aspect ratio has been completed.

Figure 6A:
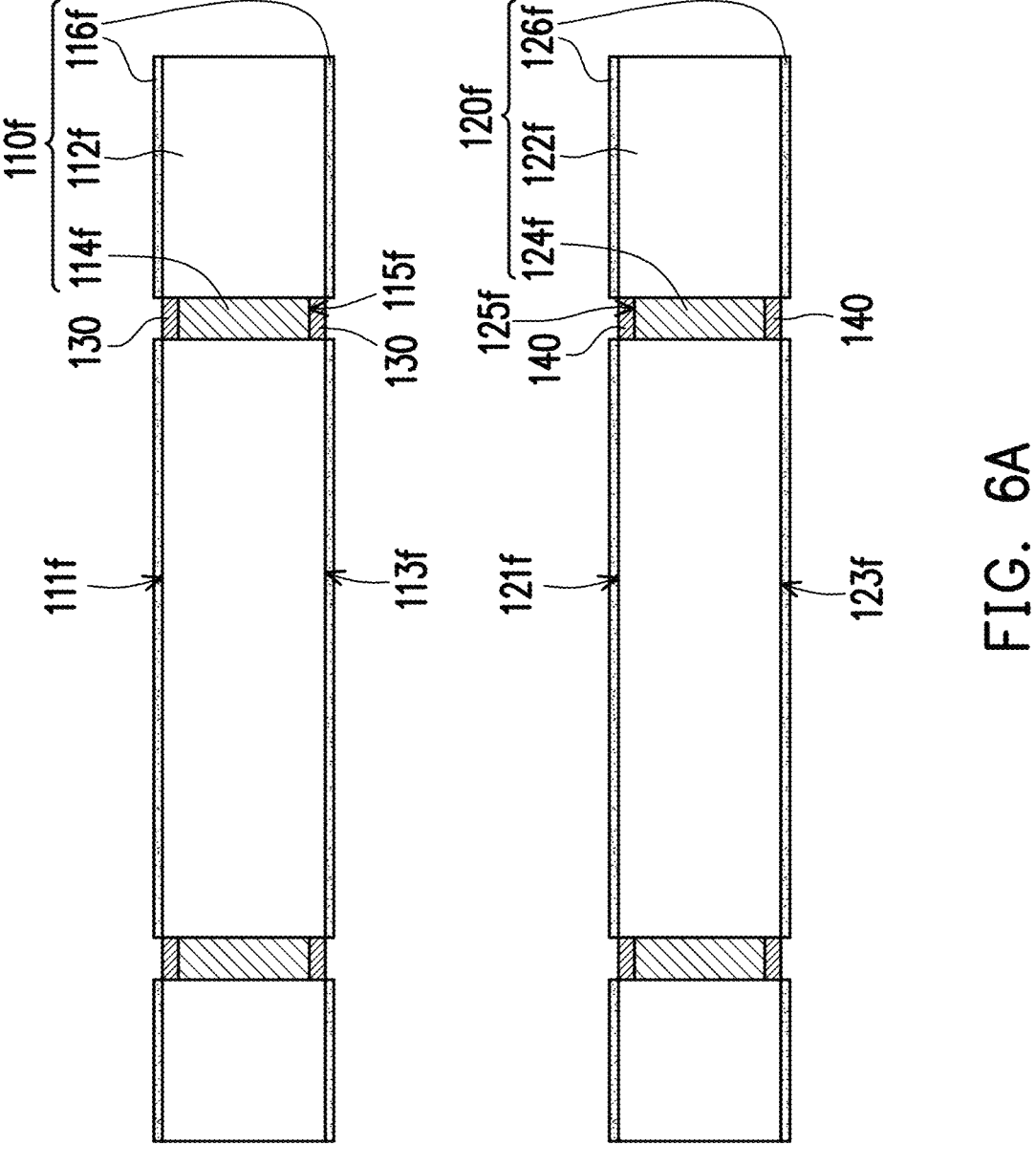
FIGS. 6A to 6B are schematic cross-sectional views of a manufacturing method of a substrate structure according to another embodiment of the disclosure.
Figure 6B:
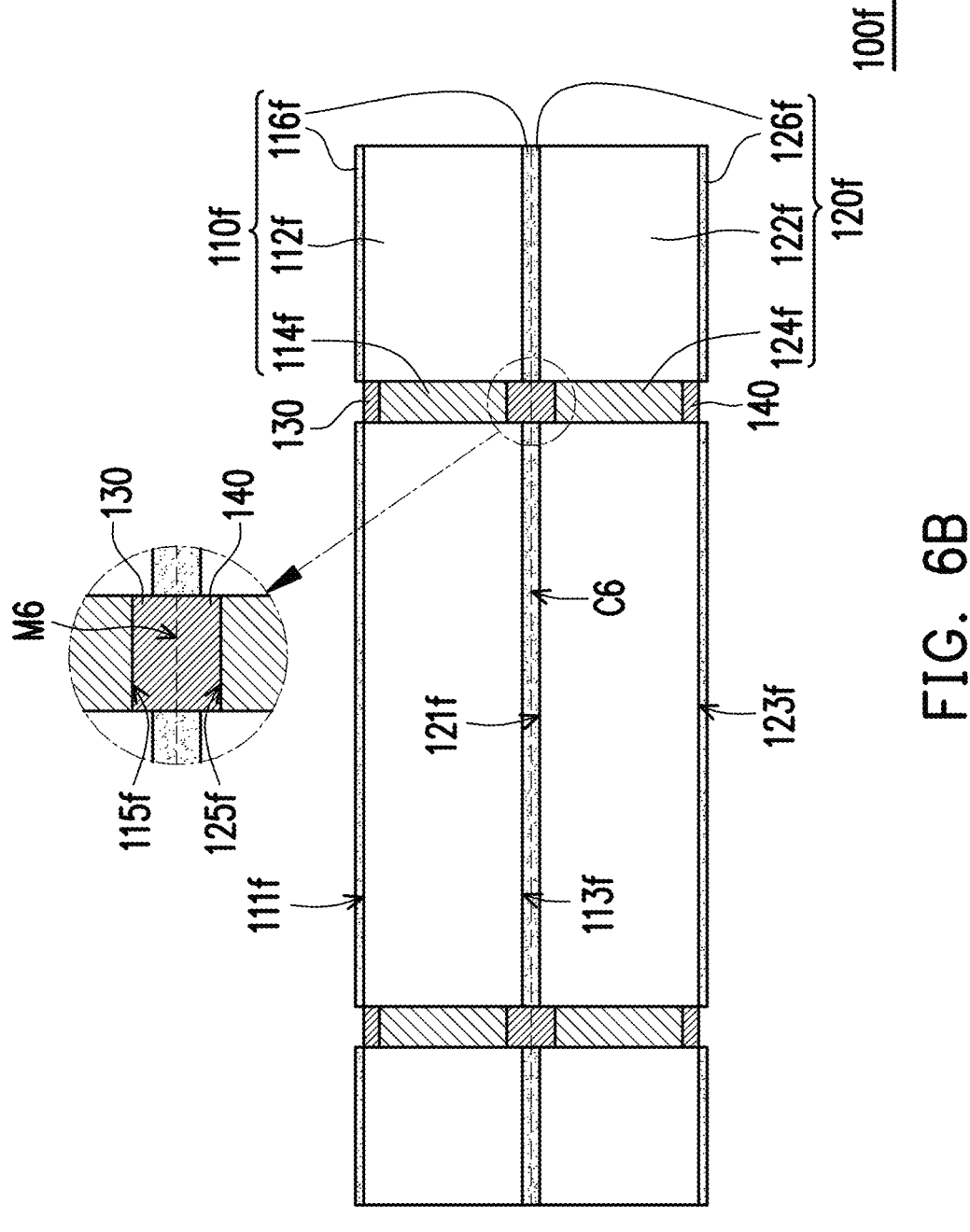

FIGS. 6A to 6B are schematic cross-sectional views of a manufacturing method of a substrate structure according to another embodiment of the disclosure. Referring to both FIGS. 5A and 6A, the manufacturing method of the substrate structure in this embodiment is similar to the manufacturing method of the above substrate structure. However, a main difference between the two is that in this embodiment, after a first organic resin layer 116f is formed on a first surface 111f, and a second surface 113f of a first glass plate 112f and a second organic resin layer 126f is formed on a third surface 121f and a fourth surface 123f of a second glass plate 122f, and before a second substrate 120f is bonded to a first substrate 110f, the first metal layer 130 is formed on a first end 115f of a first conductive via 114f, and the second metal layer 140 is formed on a second end 125f of a second conductive via 124f. The first end 115f faces the second end 125f. The material of the first metal layer 130 and the material of the second metal layer 140 are, for example, gold, respectively, and may be deposited on the first conductive via 114f and the second conductive via 124f respectively through the plating process such as electroless plating, immersion plating, or similar processes.

After that, referring to FIG. 6B, the second substrate 120*f* is bonded to the first substrate 110*f* at the high temperature. The second organic resin layer 126*f* is bonded to the first organic resin layer 116*f* through the high-temperature plasticization and defines a resin bonding contact surface C6 with the first organic resin layer 116*f*. On the other hand, the second metal layer 140 is bonded to the first metal layer 130 through the thermal expansion contact and the metal diffusion, and defines a metal bonding contact surface M6 with the first metal layer 130. So far, fabrication of a substrate structure 100*f* having the through glass via with a high aspect ratio has been completed.

Based on the above, in the substrate structure and the manufacturing method thereof in the disclosure, the second glass plate is bonded to the first glass plate through the chemical bonding force and defines the chemical bonding contact surface with the first glass plate, while the second conductive via is bonded to the first conductive via through the metal diffusion and defines the metal bonding contact surface with the first conductive via, so that the second substrate is connected to the first substrate to form the substrate structure having the through glass via with a high aspect ratio. Compared to the conventional technology, there is no need to add additional resin materials having the conductive paste and/or use the high-thickness glass substrates, and has the advantages of simple manufacturing processes, reduced costs, and increased production capacity.

Although the disclosure has been described with reference to the above embodiments, they are not intended to limit the disclosure. It will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. A substrate structure, comprising: a first substrate comprising a first glass plate and at least one first conductive via penetrating the first glass plate; and a second substrate comprising a second glass plate and at least one second conductive via penetrating the second glass plate, wherein the second substrate is connected to the first substrate, the second glass plate is bonded to the first glass plate through chemical bonding force and defines a chemical bonding contact surface with the first glass plate, and the at least one second conductive via is bonded to the at least one first conductive via through metal diffusion and defines at least one metal bonding contact surface with the at least one first conductive via, wherein a first metal layer disposed on at least one first end of the at least one first conductive via; and a second metal layer disposed on at least one second end of the at least one second conductive via, wherein the at least one first end faces the at least one second end, and the second metal layer is bonded to the first metal layer and defines the at least one metal bonding contact surface with the first metal layer.

2. The substrate structure according to claim 1, wherein a material of the at least one first conductive via and a material of the at least one second conductive via comprise copper, respectively, and a material of the at least one first metal layer and a material of the at least one second metal layer comprise gold, respectively.

3. The substrate structure according to claim 1, wherein the first substrate further comprises a first silicon oxide layer covering a peripheral surface of the first glass plate and partially located between the at least one first conductive via and the first glass plate; and the second substrate further comprises a second silicon oxide layer covering a peripheral surface of the second glass plate and partially located between the at least one second conductive via and the second glass plate, wherein the second silicon oxide layer is bonded to the first silicon oxide layer and defines the chemical bonding contact surface with the first silicon oxide layer.

4. The substrate structure according to claim 1, wherein a first thickness of the first glass plate and a second thickness of the second glass plate are respectively greater than 50 microns and less than or equal to 400 microns.

5. The substrate structure according to claim 1, wherein a first diameter of the at least one first conductive via and a second diameter of the at least one second conductive via are respectively greater than 10 microns and less than or equal to 100 microns.

6. A substrate structure, comprising: a first substrate comprising a first glass plate, at least one first conductive via penetrating the first glass plate, and a first organic resin layer, wherein the first organic resin layer is bonded to a first surface and a second surface of the first glass plate that are opposite to each other through chemical bonding force; and a second substrate comprising a second glass plate, at least one second conductive via penetrating the second glass plate, and a second organic resin layer, wherein the second organic resin layer is bonded to a third surface and a fourth surface of the second glass plate that are opposite to each other through the chemical bonding force, and the second substrate is connected to the first substrate, wherein the second organic resin layer is bonded to the first organic resin layer through high-temperature plasticization and defines a resin bonding contact surface with the first organic resin layer, and the at least one second conductive via is bonded to the at least one first conductive via through metal diffusion and defines at least one metal bonding contact surface with the at least one first conductive via, wherein first metal layer disposed on at least one first end of the at least one first conductive via; and a second metal layer disposed on at least one second end of the at least one second conductive via, wherein the at least one first end faces the at least one second end, and the second metal layer is bonded to the first metal layer and defines the at least one metal bonding contact surface with the first metal layer.

7. The substrate structure according to claim 6, wherein a material of the first organic resin layer and a material of the second organic resin layer comprise liquid crystal polymer, respectively.

8. The substrate structure according to claim 6, wherein a first thickness of the first glass plate and a second thickness of the second glass plate are respectively greater than 50 and less than or equal to 400 microns.

9. The substrate structure according to claim 6, wherein a first diameter of the at least one first conductive via and a second diameter of the at least one second conductive via are respectively greater than 10 and less than or equal to 100 microns.

10. A manufacturing method of a substrate structure, comprising: providing a first substrate and a second substrate, wherein the first substrate comprises a first glass plate and at least one first conductive via penetrating the first glass plate, and the second substrate comprises a second glass plate and at least one second conductive via penetrating the second glass plate; and bonding the second substrate to the first substrate, wherein the second glass plate is bonded to the first glass plate through chemical bonding force and forms a chemical bonding contact surface with the first glass plate, and the at least one second conductive via is bonded to the at least one first conductive via through metal diffusion and forms at least one metal bonding contact surface with the at least one first conductive via, wherein before bonding the second substrate to the first substrate, forming a first metal layer on at least one first end of the at least one first conductive via; and forming a second metal layer on at least one second end of the at least one second conductive via, wherein the at least one first end faces the at least one second end; when the second substrate is bonded to the first substrate, the second metal layer is bonded to the first metal layer and defines the at least one metal bonding contact surface with the first metal layer.

11. The manufacturing method of the substrate structure according to claim 10, further comprising:

before bonding the second substrate to the first substrate, forming a first silicon oxide layer to cover a peripheral surface of the first glass plate, wherein a portion of the first silicon oxide layer is located between the at least one first conductive via and the first glass plate; and forming a second silicon oxide layer to cover a peripheral surface of the second glass plate, wherein a portion of the second silicon oxide layer is located between the at least one second conductive via and the second glass plate;

when the second substrate is bonded to the first substrate, the second silicon oxide layer is bonded to the first silicon oxide layer and defines the chemical bonding contact surface with the first silicon oxide layer.

* * * * *